US012650483B2

(12) United States Patent
Kim

(10) Patent No.: US 12,650,483 B2
(45) Date of Patent: Jun. 9, 2026

(54) APPARATUS AND METHOD FOR MEASURING CURRENT OF BATTERY

(71) Applicant: SAMSUNG SDI CO., LTD., Yongin-si (KR)

(72) Inventor: Suk Ki Kim, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 152 days.

(21) Appl. No.: 18/396,805

(22) Filed: Dec. 27, 2023

(65) Prior Publication Data

US 2025/0138128 A1 May 1, 2025

(30) Foreign Application Priority Data

Oct. 26, 2023 (KR) ........................ 10-2023-0144716

(51) Int. Cl.
*G01R 35/00* (2006.01)
*G01R 31/382* (2019.01)

(52) U.S. Cl.
CPC ........... *G01R 35/00* (2013.01); *G01R 31/382* (2019.01)

(58) Field of Classification Search
CPC ...... G01R 35/00; G01R 31/382; G01R 1/203; G01R 15/14; G01R 19/0092; G01R 31/385; G01R 31/387; G01R 35/02; G01R 19/16571; G01R 31/367; G01R 31/374; Y02E 60/10
See application file for complete search history.

(56) References Cited

U.S. PATENT DOCUMENTS

| | | | | |
|---|---|---|---|---|
| 11,353,484 | B2 * | 6/2022 | Choi ................. | G01R 31/2829 |
| 2017/0168131 | A1 * | 6/2017 | Schneider ............ | B60L 3/0038 |
| 2024/0201268 | A1 | 6/2024 | Kong et al. | |

FOREIGN PATENT DOCUMENTS

| | | |
|---|---|---|
| KR | 10-2021-0104457 A | 8/2021 |
| KR | 10-2023-0084925 A | 6/2023 |

OTHER PUBLICATIONS

Extended European Search Report issued on Oct. 8, 2024 in the corresponding European Patent Application No. 24164250.3.

* cited by examiner

*Primary Examiner* — Douglas X Rodriguez
(74) *Attorney, Agent, or Firm* — Lee IP Law, P.C.

(57) ABSTRACT

A battery current measurement apparatus includes a first sensor part connected to a battery and measuring a current thereof, a second sensor part connected to the first sensor part and measuring a current, a switch part connected to the second sensor part and switching connection of the second sensor part, and a processor calculating a current of the battery based on a first current value of the first sensor part and a second current value of the second sensor part, calculating a state of charge (SOC) of the battery corresponding thereto, and comparing the first current value with the second current value to detect a defective current sensor among multiple current sensors included in the first and second sensor parts. A corresponding battery current measurement method is also provided.

15 Claims, 4 Drawing Sheets

Figure 4:
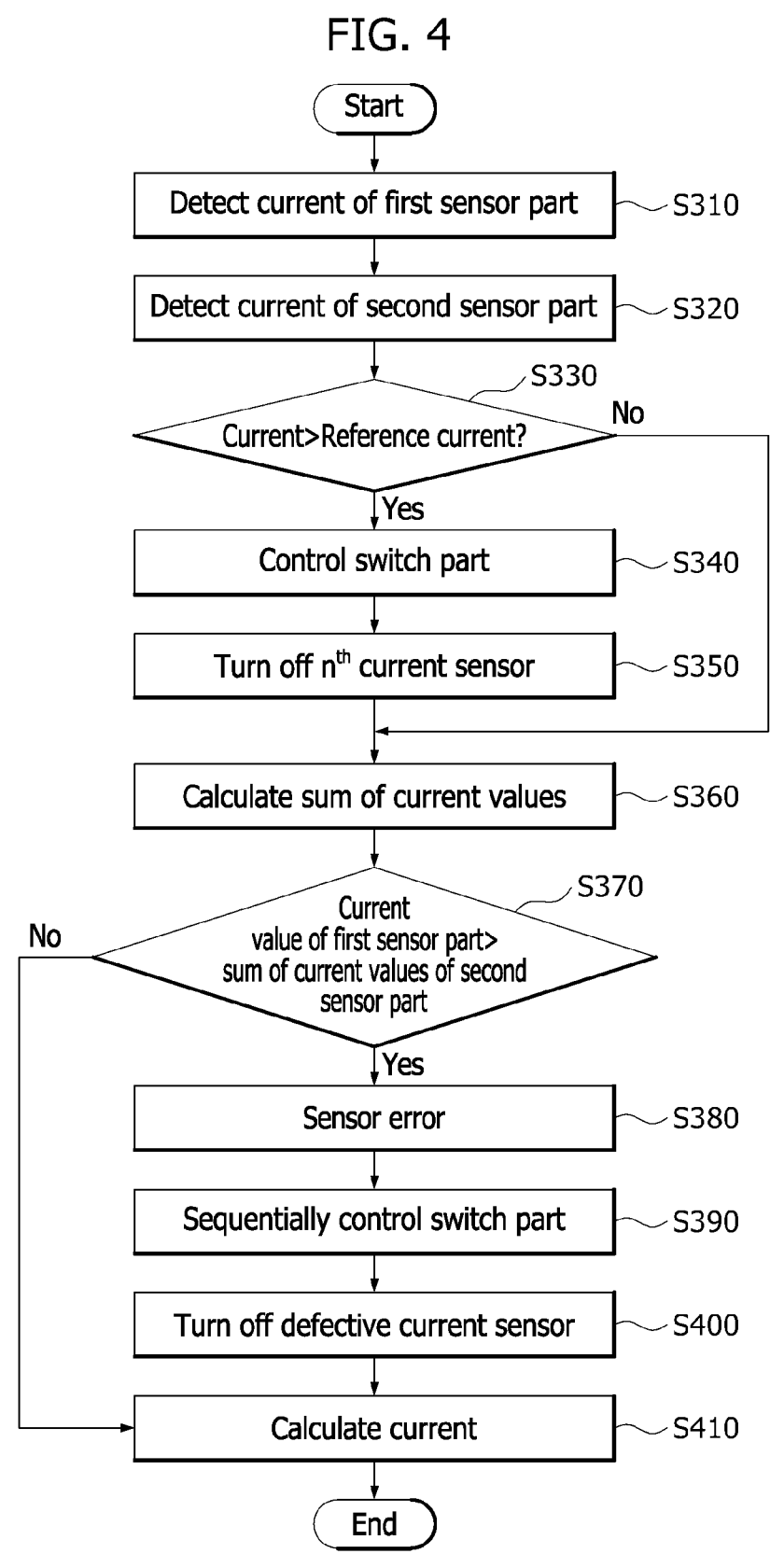

Start

Detect current of first sensor part ~ S310

Detect current of second sensor part ~ S320

S330
Current>Reference current? — No

Yes

Control switch part ~ S340

Turn off $n^{th}$ current sensor ~ S350

Calculate sum of current values ~ S360

S370
Current value of first sensor part> sum of current values of second sensor part No Yes Sensor error ~ S380

Sequentially control switch part ~ S390

Turn off defective current sensor ~ S400

Calculate current ~ S410

End

APPARATUS AND METHOD FOR MEASURING CURRENT OF BATTERY

CROSS-REFERENCE TO RELATED APPLICATION

The present application claims the benefit of Korean Patent Application No. 10-2023-0144716, filed on Oct. 26, 2023 in the Korean Intellectual Property Office, the entire disclosure of which is incorporated herein by reference.

BACKGROUND

1. Field

The present disclosure relates to a battery current measurement apparatus connected to a battery to measure a current of the battery and detect failure of a current sensor, and a battery current measurement method thereof.

2. Description of the Related Art

In recent years, the application of batteries has been expanded not only to mobile devices, such as mobile phones, tablet computers, and the like, but also to electric vehicles (EVs, HEVs, PHEVs), energy storage systems (ESS), and the like.

Batteries generate heat upon charging and discharging, and current sensors for measuring charging and discharging currents of the batteries are disposed near battery cells and thus affected by heat generated from the battery cells, causing increased measurement errors or failure.

As a result, there is growing interest in accurate measurement of the charging and discharging currents of the batteries and in detection of failure of the current sensors.

SUMMARY

Embodiments include a battery current measuring apparatus, which may include a first sensor part connected to a battery and measuring a current, a second sensor part connected to the first sensor part and measuring a current, a switch part connected to the second sensor part and switching connection of the second sensor part, and a processor calculating a current of the battery based on a first current value of the first sensor part and a second current value of the second sensor part, calculating a state of charge (SOC) of the battery corresponding thereto, and comparing the first current value with the second current value to detect a defective current sensor among a plurality of current sensors included in the first and second sensor parts.

The battery current measuring apparatus may include, upon determining that the first current value and the second current value are the same within a tolerance, the processor may determine that the first sensor part and the second sensor part operate normally, and upon determining that the first current value and the second current value are different, the processor may determine that any one of the first and second sensor parts has failed.

In the battery current measuring apparatus, the second sensor part may include at least two current sensors among the plurality of current sensors connected to one another in parallel, and the processor may calculate the second current value by summing current values measured by the at least two current sensors.

The battery current measuring apparatus, wherein, when the first current value and the second current value are different, the processor compares current values of the at least two current sensors to determine that a current sensor corresponding to a current value outside a preset range is the defective current sensor.

The battery current measuring apparatus, wherein the at least two current sensors includes a third current sensor, a fourth current sensor and a fifth current sensor and wherein the switch part includes a first switch connected in series to the third current sensor, a second switch connected in series to the fourth current sensor; and a third switch connected in series to the fifth current sensor, any one of the first to third switches being turned on or off in response to a control signal from the processor.

The battery current measuring apparatus, wherein, when the first current value and the second current value are different, the processor controls the first to third switches to be sequentially turned off and calculates the second current value from current values of two current sensors among the third current sensor, the fourth current sensor and the fifth current sensor of the second sensor part in response to operation of the switch part to detect the defective current sensor through comparison of the second current value with the first current value.

The battery current measurement apparatus, wherein, upon determining that the third to fifth current sensors operate normally, the processor may determine that the first current sensor of the first sensor part has failed.

The battery current measurement apparatus, wherein the processor may turn off a switch connected to the defective current sensor among the first to third switches to disconnect the defective current sensor.

Embodiments include a battery current measurement method that includes measuring, by a first sensor part connected to a battery, a current, measuring, by a second sensor part connected to the first sensor part, a current, detecting, by a processor, a defective current sensor among a plurality of current sensors included in the first and second sensor parts by comparing a first current value of the first sensor part with a second current value of the second sensor part, controlling, by the processor, a switch part to disconnect the defective current sensor, and calculating, by the processor, a current of the battery based on the first current value and the second current value, followed by calculating a state of charge (SOC) of the battery corresponding thereto.

The battery current measurement method may include, in the step of measuring, by the second sensor part connected to the first sensor part, a current, the processor may calculate the second current value by summing current values measured by third to fifth current sensors included in the second sensor part and connected to one another in parallel.

The battery current measurement method, wherein the step of detecting a defective current sensor may include comparing, by the processor, the first current value with the second current value, determining, by the processor, that the first sensor part and the second sensor part operate normally, when the first current value and the second current value are the same within a tolerance, and determining, by the processor, that any one of the current sensors included in the first and second sensor parts is the defective current sensor, when the first current value and the second current value are different.

The battery current measurement method, wherein the step of detecting a defective current sensor may further include determining that a corresponding current sensor is the defective current sensor, when any one of current values input from third to fifth current sensors of the second sensor part is outside a preset range.

The battery current measurement method, wherein the step of detecting a defective current sensor may further include sequentially turning off first to third switches included in the switch part to disconnect a current sensor connected to each of the switches, comparing the second current value with the first current value by calculating the second current value from current values measured by two current sensors normally connected, controlling the next switch, when the first current value and the second current value are different, and determining, by the processor, that the disconnected current sensor is the defective current sensor, when the first current value and the second current value are the same.

The battery current measurement method, wherein the step of detecting a defective current sensor may further include determining that a first current sensor of the first sensor part is the defective current sensor, upon determining that a plurality of current sensors of the second sensor part operate normally.

The battery current measurement method, wherein the step of disconnecting the defective current sensor may further include turning off a switch connected to the defective current sensor among first to third switches included in the switch part to disconnect the defective current sensor.

BRIEF DESCRIPTION OF THE DRAWINGS

Features will become apparent to those of skill in the art by describing in detail exemplary embodiments with reference to the attached drawings in which:

FIG. 2 is a diagram illustrating a connection configuration of the battery pack including the current measurement apparatus according to one or more embodiments of.

FIG. 4 is a flowchart illustrating a battery current measurement and failure detection method of the current measurement apparatus according to one or more embodiments.

DETAILED DESCRIPTION

Figure 1:
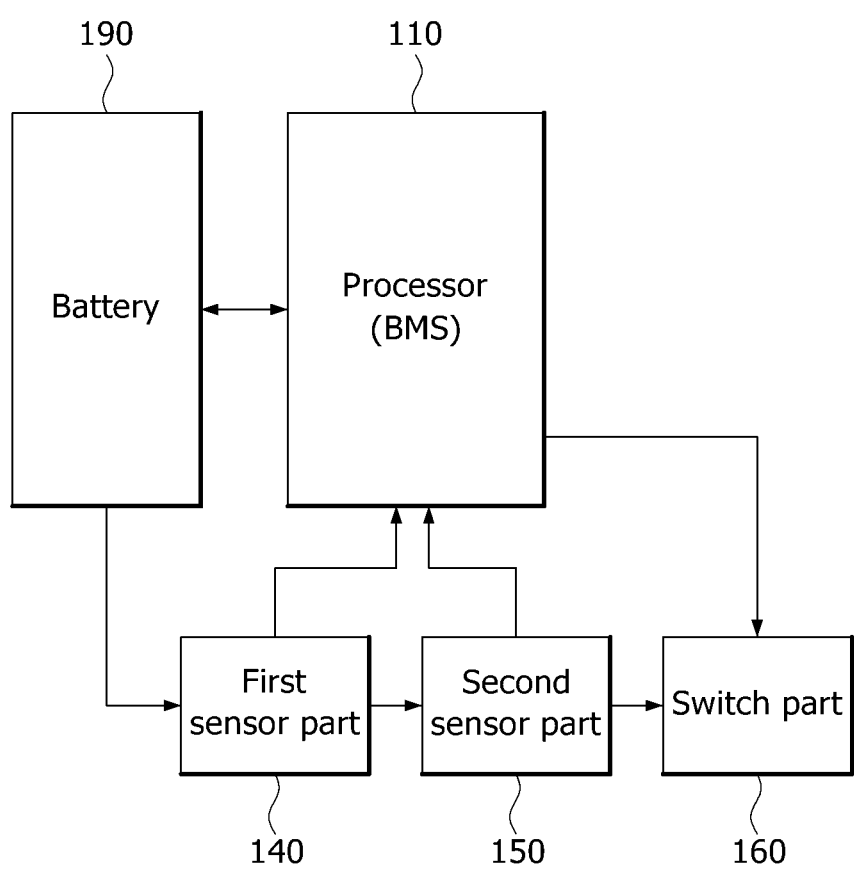
FIG. 1 is a block diagram of a battery pack including a current measurement apparatus according to one or more embodiments.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. It will also be understood that when a layer is referred to as being "between" two layers, it can be the only layer between the two layers, or one or more intervening layers may also be present.

Hereinafter, exemplary embodiments will be described in detail with reference to the accompanying drawings. The drawings may be exaggerated in width, length, and thickness of components for descriptive convenience and clarity only.

FIG. 1 is a block diagram of a battery pack including a current measurement apparatus according to one or more embodiments.

Referring to FIG. 1, a current measurement apparatus is connected to a battery 190 to be included in a battery pack

100, and may include a first sensor part 140, a second sensor part 150, a switch part 160, and a processor 110.

The battery 190 may be charged by a supplied charging current and may output a charged current. The battery 190 may include a plurality of battery cells.

The first sensor part 140 may be connected to the battery 190 to sense a current output from the battery 190 and applies the sensed current to the processor 110. The first sensor part 140 may include at least one current sensor.

The second sensor part 150 may be connected to the first sensor part 140 to sense the current of the battery 190. The second sensor part 150 may include multiple current sensors.

The switch part 160 may be connected to the second sensor part 150 to switch connection of the second sensor part 150. The switch part 160 switches connection of at least one of multiple current sensors included in the second sensor part 150 in response to a control signal from the processor 110.

The processor 110 may calculate the state of charge (SOC) of the battery 190 based on current values input from the first sensor part 140 and the second sensor part 150.

The processor 110 may be a battery management system (BMS) or a main control unit (MCU). The processor 110 may include a memory or a buffer.

The processor 110 may detect failure of a current sensor by comparing the current values of the first sensor part 140 and the second sensor part 150. The processor 110 may detect failure of the current sensor by comparing the first current value of the first sensor part 140 with the second current value of the second sensor part 150 and determining whether the two current values are the same.

Upon determining that any one of the current sensors has failed, the processor 110 may control the switch part 160 to detect the defective current sensor. The processor 110 may send a control signal to the switch part 160 to disconnect the defective current sensor.

By disconnecting the defective current sensor, the processor 110 allows the current to be measured without the defective current sensor.

The processor 110 may generate an alarm upon failure of at least one current sensor.

In some embodiments, the current measurement apparatus may measure a correct current of the battery 190 through normal current sensors by excluding the defective current sensor.

Figure 2:
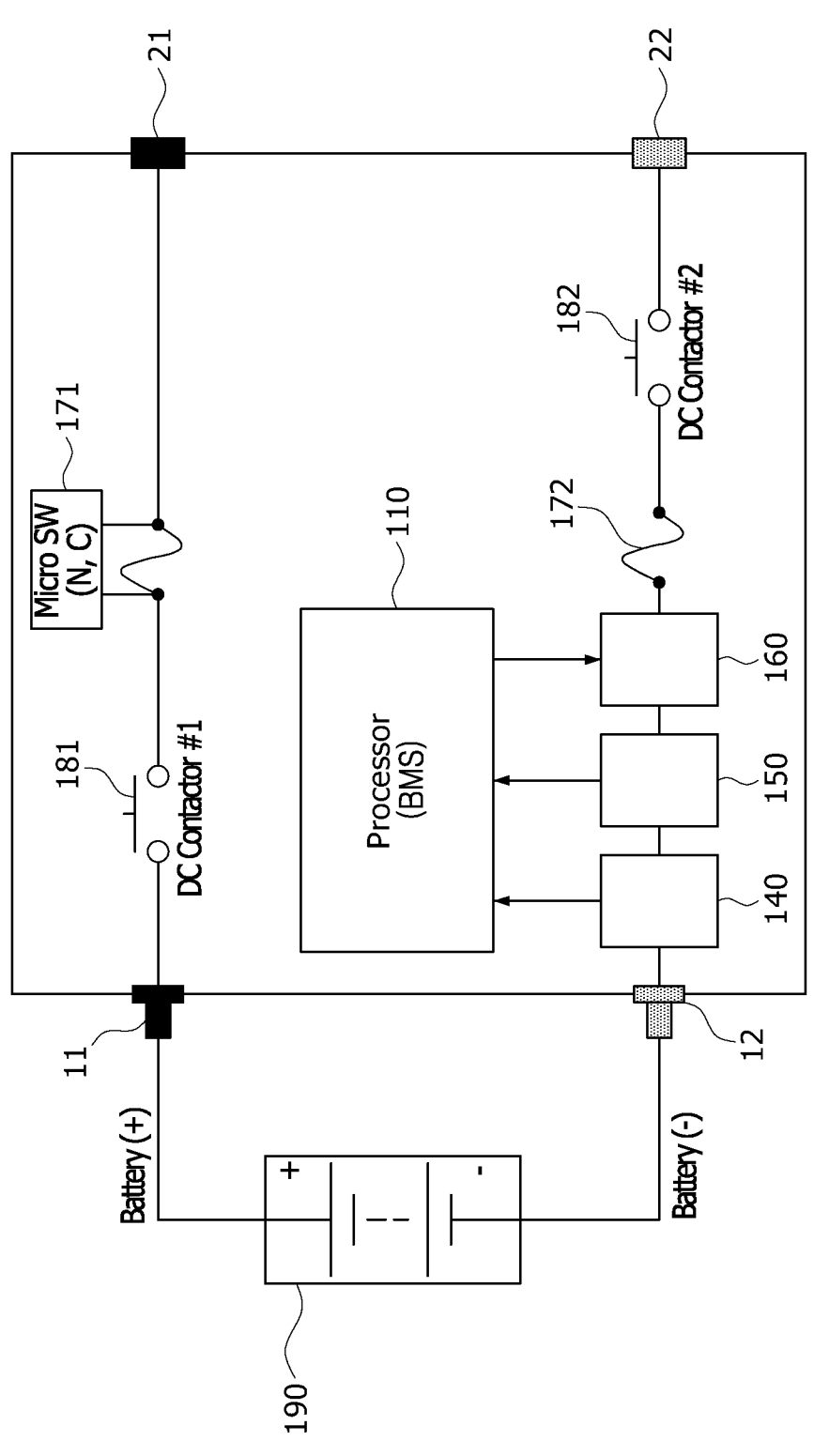

FIG. 2 is a diagram illustrating a connection configuration of the battery pack including the current measurement apparatus according to one or more embodiments.

Referring to FIG. 2, the current measurement apparatus may include a first terminal 11 connected to a cathode of the battery 190 and a second terminal 12 connected to an anode of the battery 190. In some embodiments, the current measurement apparatus may include a third terminal 21 connected to the first terminal 11 and a fourth terminal 22 connected to the second terminal 12.

The first terminal 11 may be connected to the third terminal 21 through a first DC connector 181 and a first micro switch 171.

The second terminal 12 may be connected to the first sensor part 140, the second sensor part 150, and the switch part 160. In some embodiments, the second terminal 12 may be connected to the fourth terminal 22 through a second micro switch (Micro SW) and a second connector (DC Connector) 182 connected to the switch part 160.

The first sensor part 140 may be connected at one end thereof to the second terminal 12 and at the other end thereof to the second sensor part 150. The second sensor part 150 may be connected in series to the first sensor part 140.

The switch part 160 may be connected in series to the second sensor part 150.

The switch part 160 may include a plurality of switches respectively connected in series to a plurality of current sensors included in the second sensor part 150.

The processor 110 may operate in any one of a charging mode and a discharging mode by controlling the first DC connector 181, the second connector 182, the first micro switch 171 and the second micro switch 172 in response to charging of the battery 190 or outputting of a discharging current therefrom.

The processor 110 may be connected to the first sensor part 140 and the second sensor part 150 to control the switch part 160 depending on a measured current value.

The processor 110 may interrupt the charging mode or the discharging mode of the battery 190 to establish a test mode in the event of failure of any one of the multiple current sensors included in the first sensor part 140 and the second sensor part 150.

The processor 110 may control the switch part 160, depending on the measured current value, to detect and disconnect a defective current sensor, and may control the current sensors to operate in the charging mode or the discharging mode again.

Figure 3:
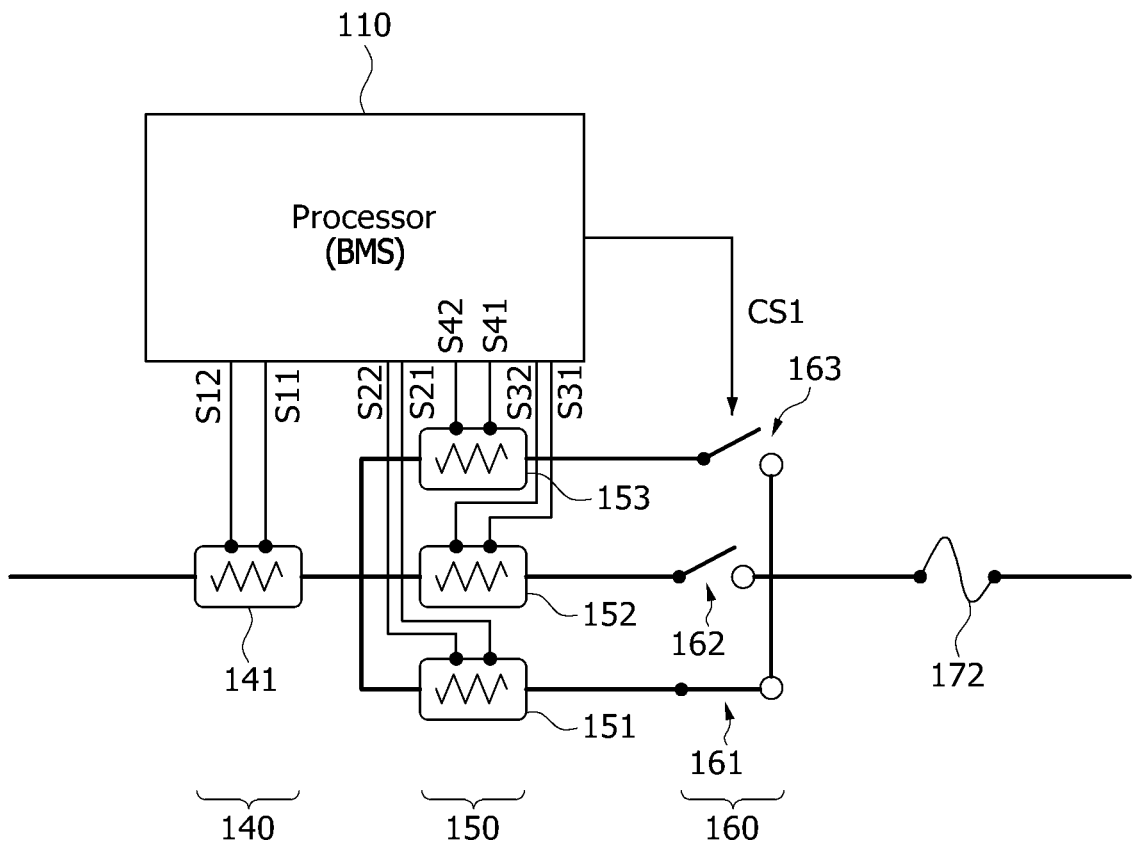
FIG. 3 is a diagram illustrating the configuration of the current measurement apparatus according to one or more embodiments.

FIG. 3 is a diagram illustrating an example configuration of the current measurement apparatus according to one or more embodiments.

As shown in FIG. 3, the current measurement apparatus may measure a current of the battery 190 and may detect failure of a current sensor.

The first sensor part 140 may include a first current sensor 141.

In some embodiments, the first sensor part 140 may further include a second current sensor (not shown). The second current sensor may be connected in parallel to the first current sensor 141.

The first current sensor 141 may be connected at both ends S11, S12 thereof to the processor 110 to apply a first current value to the processor 110.

The second sensor part 150 may be connected in series to the first current sensor 141.

The second sensor part 150 may include a third current sensor 151, a fourth current sensor 152, and a fifth current sensor 153. In some embodiments, the second sensor part 150 may further include a sixth current sensor (not shown).

The third to fifth current sensors 151 to 153 may be connected to one another in parallel.

The third current sensor 151 may be connected at both ends S21, S22 thereof to the processor 110 to apply a third current value to the processor 110.

The fourth current sensor 152 may be connected at both ends S31, S32 thereof to the processor 110 to apply a fourth current value to the processor 110.

The fifth current sensor 153 may be connected at both ends S41, S42 thereof to the processor 110 to apply a fifth current value to the processor 110.

The processor 110 may sum the third current value, the fourth current value, and the fifth current value to calculate the second current value.

The switch part 160 may include multiple switches respectively connected in series to the current sensors of the second sensor part 150.

The switch part 160 may include a first switch 161, a second switch 162, and a third switch 163.

The first to third switches 161 to 163 may be connected to one another in parallel.

If the second sensor part 150 further includes a sixth current sensor, the switch part 160 may further include a fourth switch connected to the sixth current sensor.

The first switch 161 may be connected in series to the third current sensor 151 to connect or disconnect the third current sensor 151.

The second switch 162 may be connected in series to the fourth current sensor 152 to connect or disconnect the fourth current sensor 152.

The third switch 163 may be connected in series to the fifth current sensor 153 to connect or disconnect the fifth current sensor 153.

In the switch part 160, the first to third switches 161 to 163 may be turned on or turned off in response to a control signal CS1 from the processor 110.

The processor 110 may compare the first current value measured by the first current sensor 141 with the second current value, which is the sum of the current values measured by the third to fifth current sensors 151 to 153.

If the first current value and the second current value are the same within a tolerance, the processor 110 may determine that all of the first current sensor 141 and the third to fifth current sensors 151 to 153 operate normally.

The processor 110 may send the control signal CS1 to allow the first to third switches 161 to 163 to be maintained in an ON state.

If there is a difference between the first current value and the second current value by a certain value or more, the processor 110 may determine that one of the current sensors has failed.

The processor 110 may compare the respective current values of the third to fifth current sensors 151 to 153 to determine a defective current sensor.

The processor 110 may determine whether the third current value, the fourth current value, and the fifth current value are within a preset range.

If at least one of the third current value, the fourth current value, and the fifth current value is different or outside the preset range, the processor 110 may detect a current sensor, which provides the corresponding current value, as the defective current sensor.

Further, the processor 110 may control the plurality of switches in the switch part 160 to detect the defective current sensor.

The processor 110 may sequentially turn off the first switch 161 and the third switch 163 to detect the defective current sensor through summation of two current values.

The processor 110 may sequentially control any one of the first to third switches 161 to 163 of the switch part 160 to be turned off.

With the first switch 161 turned off, the processor 110 may compare the first current value measured by the first current sensor 141 with the second current value, which may be the sum of the current values measured by the fourth current sensor 152 and the fifth current sensor 153.

If the first current value and the second current value are the same, the processor 110 may determine that the third current sensor 151 has failed.

If the first current value and the second current value are different, the processor 110 may control the switch part 160 again.

The processor 110 may send a control signal to allow the first switch 161 to be turned on and the second switch 162 to be turned off.

With the fourth current sensor 152 disconnected through the second switch 162, the processor 110 may compare the first current value measured by the first current sensor 141 with the second current value, which may be the sum of the current values measured by the third current sensor 151 and the fifth current sensor 153.

If the first current value and the second current value are the same, the processor 110 may determine that the fourth current sensor 152 is the defective current sensor.

If the first current value and the second current value are different, the processor 110 may control the third switch 163.

With the fifth current sensor 153 disconnected, the processor 110 may detect the defective current sensor by comparing the first current value with the second current value.

If all of the current sensors of the second sensor part 150 operate normally, the processor 110 may determine that the first current sensor 141 has failed.

The processor 110 may send a control signal CS1 to the switch part 160 to turn off a switch connected to the defective current sensor.

As a result, as the defective current sensor may be disconnected, such that the current measurement apparatus can easily detect and exclude the defective current sensor, thereby improving measurement accuracy.

In some embodiments, the processor 110 may calculate the state of charge (SOC) of the battery 190 based on the current values of the first sensor part 140 and the second sensor part 150 that operate normally.

The first sensor part 140 may further include a second current sensor connected to the first current sensor 141 in parallel and a switch connected thereto to detect the defective current sensor by sequentially controlling the switches to be turned on or off.

Further, the processor 110 may detect failure of a current sensor based on a result of comparing the first current value with the second current value, as described above.

The processor 110 may be connected to the second terminal 12 to receive the current value measured through the first sensor part 140 and the second sensor part 150 to determine the state of charge (SOC) of the battery 190.

The processor 110 may determine the current value of the battery 190 based on the first current value of the first sensor part 140 and the second current value of the second sensor part 150.

Further, the processor 110 may detect failure of a certain current sensor included in the first sensor part 140 and the second sensor part 150 based on the first current value of the first sensor part 140 and the second current value of the second sensor part 150.

FIG. 4 is a flowchart illustrating a battery current measurement and failure detection method of the current measurement apparatus according to one or more embodiments.

Referring to FIG. 4, the current measurement apparatus may determine the state of charge of the battery 190 and may detect a defective current sensor.

The first sensor part 140 may sense a first current value through the first current sensor 141 and apply the first current value to the processor 110 (S310).

The processor 110 may receive the first current value from the first current sensor 141 of the first sensor part 140.

The second sensor part 150 may sense current values through the third to fifth current sensors 151 to 153 and apply the current values to the processor 110 (S320).

The third current sensor 151 may measure a third current value, the fourth current sensor 152 may measure a fourth current value, and the fifth current sensor 153 may measure a fifth current value.

The processor 110 may compare the measured current with a reference current (S330). If the measured current is less than the reference current, the processor 110 may control the switch part 160 (S340) and turn off one of the switches to disconnect any one of current sensors ($n^{th}$ current sensor) of the second sensor part 150 (S350).

Because the magnitude of the current is small, the processor 110 may allow only a few current sensors to measure the current.

The processor 110 may calculate the second current value which may be the sum of the current values of the second sensor part 150 (S360).

The processor 110 may calculate the second current value by summing the current values of the third to fifth current sensors 151 to 153 of the second sensor part 150.

The processor 110 may compare the first current value with the second current value (S370).

If the first current value and the second current value are the same within a tolerance, the processor 110 may determine that the current sensors included in the first sensor part 140 and the second sensor part 150 operate normally.

In another embodiment, if the first current value of the first sensor part 140 and the second current value of the second sensor part 150 are different, the processor 110 may determine that any one of the current sensors has failed (S380).

The processor 110 may check the magnitudes of the third to fifth current values of the third to fifth current sensors 151 to 153 of the second sensor part 150, and may detect a current value, which may be outside a preset range.

The processor 110 may determine that a current sensor corresponding to the current value outside the preset range has failed. The processor 110 may sequentially disconnect any one of the third to fifth current sensors 151 to 153 of the second sensor part 150 by sequentially turning off the first to third switches 161 to 163.

The processor 110 may compare the sum of current values of two current sensors with the first current value and may detect a defective current sensor based on a comparison result.

If all of the current sensors of the second sensor part 150 operate normally, the processor 110 may determine that the first current sensor 141 has failed.

If the defective current sensor is detected, the processor 110 may control a switch connected to the defective current sensor to be turned off (S390).

The switch part 160 turns off an $N^{th}$ switch in response to a control signal.

In some embodiments, as the switch connected to the defective current sensor is turned off, the defective current sensor may be disconnected (S400).

After disconnecting the defective current sensor, the processor 110 may calculate the current of the battery 190 and the state of charge (SOC) of the battery 190 corresponding to the first current value and the second current value (S410).

The processor 110 may generate and externally transmit an alarm about the presence of the defective current sensor. In other embodiments, where the first current sensor has failed, the processor 110 may turn off operation of the current measurement apparatus.

Conventionally, measurement of battery current is performed by a single sensor covering the entire current range or several sensors each covering part thereof. In addition, such a current measurement method may employ interpolation of a line connecting two points.

However, such a current measurement method has a problem of uneven accuracy of measurements over the entire current measurement region.

Moreover, in this current measurement method, current sensors can generate heat upon measurement of a high current, thereby causing deterioration in measurement accuracy through an increase in internal resistance.

If a certain current sensor has failed, the battery cannot distinguish the defective current sensor from normal current sensors and it is necessary to replace all of the current sensors or to check measurement values one by one.

In some embodiments, the battery current measurement apparatus and method according to the present disclosure can easily detect and disconnect a defective current sensor to accurately calculate the current and state of charge of a battery. Furthermore, the battery current measurement apparatus and method according to the present disclosure can measure a high current by distributing the high current through multiple current sensors.

The present disclosure provides a battery current measurement apparatus and method capable of minimizing heat generation and resistance increase by a current sensor while improving accuracy of current measurement through current distribution.

According to an embodiment of the present disclosure, the battery current measurement apparatus and method can reduce heat generation and a measurement error associated with temperature through current distribution even at a high limit current.

According to one or more embodiments, the battery current measurement apparatus and method can improve accuracy of current measurement.

According to one or more embodiments, the battery current measurement apparatus and method can easily detect failure of a current sensor and can easily distinguish a defective current sensor using a plurality of current sensors connected to one another in parallel.

Although the present invention has been described with reference to some example embodiments, it should be understood by those skilled in the art that these embodiments are given by way of illustration only, and that various modifications, variations and alterations can be made without departing from the spirit and scope of the invention. Therefore, the scope of the invention should be defined only by the accompanying claims and equivalents thereto. Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. It will be understood by those of skill in the art that various changes in form and details may be made without departing from the spirit and scope of the present invention as set forth in the following claims.

What is claimed is:

1. A battery current measuring apparatus, comprising:
a first sensor part connected to a battery and measuring a first current, resulting in a first current value;

a second sensor part connected to the first sensor part and measuring a second current, resulting in a second current value;

a switch part connected to the second sensor part and switching connection of the second sensor part; and a processor adapted to calculate a current of the battery based on the first current value of the first sensor part and the second current value of the second sensor part, calculate a state of charge (SOC) of the battery corresponding thereto, and compare the first current value with the second current value to detect a defective current sensor among a plurality of current sensors included in the first and second sensor parts wherein the second sensor part comprises a plurality of current sensors connected to one another in parallel, and wherein the switch part comprises a plurality of switches, each of the plurality of switches being connected in series to a respective on of the plurality of current sensors.

2. The battery current measuring apparatus as claimed in claim 1, wherein, upon determining that the first current value and the second current value are the same within a tolerance, the processor determines that the first sensor part and the second sensor part operate normally, and upon determining that the first current value and the second current value are different, the processor determines that any one of the first and second sensor parts has failed.

3. The battery current measuring apparatus as claimed in claim 1, wherein the processor calculates the second current value by summing current values measured by the at least two current sensors of the plurality of current sensors of the second part.

4. The battery current measuring apparatus as claimed in claim 3, wherein, when the first current value and the second current value are different, the processor compares current values of the at least two current sensors to determine that a current sensor corresponding to a current value outside a preset range is the defective current sensor.

5. The battery current measuring apparatus as claimed in claim 3, wherein the second sensor part includes a third current sensor, a fourth current sensor and a fifth current sensor and wherein the switch part includes:
a first switch connected in series to the third current sensor;
a second switch connected in series to the fourth current sensor; and
a third switch connected in series to the fifth current sensor,
any one of the first to third switches being turned on or off in response to a control signal from the processor.

6. The battery current measuring apparatus as claimed in claim 5, wherein, when the first current value and the second current value are different, the processor controls the first to third switches to be sequentially turned off and calculates the second current value from current values of two current sensors among the third current sensor, the fourth current sensor and the fifth current sensor of the second sensor part in response to operation of the switch part to detect the defective current sensor through comparison of the second current value with the first current value.

7. The battery current measuring apparatus as claimed in claim 6, wherein, upon determining that the third to fifth current sensors operate normally, the processor determines that the first current sensor of the first sensor part has failed.

8. The battery current measuring apparatus as claimed in claim 5, wherein the processor turns off a switch connected to the defective current sensor among the first to third switches to disconnect the defective current sensor.

9. A battery current measurement method, comprising:

measuring, by a first sensor part connected to a battery, a first current, resulting in a first current value;

measuring, by a second sensor part connected to the first sensor part, a second current, resulting in a second current value;

detecting, by a processor, a defective current sensor among a plurality of current sensors included in the first and second sensor parts by comparing the first current value of the first sensor part with the second current value of the second sensor part;

controlling, by the processor, a switch part to disconnect the defective current sensor; and calculating, by the processor, a current of the battery based on the first current value and the second current value, followed by calculating a state of charge (SOC) of the battery corresponding thereto, wherein disconnecting the defective current sensor further comprises turning of a switch connected to the defective current sensor among a plurality of switches included in the switch part to disconnect the defective current sensor.

10. The battery current measurement method as claimed in claim 9, wherein, in the step of measuring, by the second sensor part connected to the first sensor part, a current, the processor calculates the second current value by summing current values measured by third to fifth current sensors included in the second sensor part and connected to one another in parallel.

11. The battery current measurement method as claimed in claim 9, wherein the step of detecting a defective current sensor includes:

comparing, by the processor, the first current value with the second current value;

determining, by the processor, that the first sensor part and the second sensor part operate normally, when the first current value and the second current value are the same within a tolerance; and determining, by the processor, that any one of the current sensors included in the first and second sensor parts is the defective current sensor, when the first current value and the second current value are different.

12. The battery current measurement method as claimed in claim 11, wherein the step of detecting a defective current sensor further includes: determining that a corresponding current sensor is the defective current sensor, when any one of current values input from third to fifth current sensors of the second sensor part is outside a preset range.

13. The battery current measurement method as claimed in claim 11, wherein the step of detecting a defective current sensor further includes:

sequentially turning off first to third switches included in the switch part to disconnect a current sensor connected to each of the switches;

comparing the second current value with the first current value by calculating the second current value from current values measured by two current sensors normally connected;

controlling the next switch, when the first current value and the second current value are different; and determining, by the processor, that the disconnected current sensor is the defective current sensor, when the first current value and the second current value are the same.

14. The battery current measurement method as claimed in claim 11, wherein the step of detecting a defective current sensor further includes: determining that a first current sensor of the first sensor part is the defective current sensor, upon determining that a plurality of current sensors of the second sensor part operate normally.

15. The battery current measurement method as claimed in claim 9, wherein the step of disconnecting the defective current sensor further includes: turning off a switch connected to the defective current sensor among first to third switches included in the switch part to disconnect the defective current sensor.

* * * * *